United States Patent
Yuasa et al.

(10) Patent No.: US 6,930,394 B2
(45) Date of Patent: Aug. 16, 2005

(54) ELECTRONIC DEVICE INCLUDES AN INSULATING FILM HAVING DENSITY OR CARBON CONCENTRATION VARYING GRADUALLY IN THE DIRECTION OF THE THICKNESS AND A CONDUCTIVE FILM FORMED THEREIN

(75) Inventors: Hiroshi Yuasa, Kyoto (JP); Tetsuo Satake, Hyogo (JP); Masazumi Matsuura, Tokyo (JP); Kinya Goto, Tokyo (JP)

(73) Assignees: Matsushita Electric Industrial Co., Ltd., Osaka (JP); Mitsubishi Denki Kabushiki Kaisha, Tokyo (JP)

( * ) Notice: Subject to any disclaimer, the term of this patent is extended or adjusted under 35 U.S.C. 154(b) by 74 days.

(21) Appl. No.: 10/621,638

(22) Filed: Jul. 18, 2003

(65) Prior Publication Data
US 2004/0089924 A1 May 13, 2004

(30) Foreign Application Priority Data

Oct. 25, 2002 (JP) ........................ 2002-311397

(51) Int. Cl.⁷ .......................................... H01L 23/522
(52) U.S. Cl. ..................................... 257/760
(58) Field of Search ................. 257/758–760; 438/618, 622–623, 787–790

(56) References Cited

U.S. PATENT DOCUMENTS

| | | | | |
|---|---|---|---|---|
| 6,350,670 B1 | * | 2/2002 | Andideh et al. | 438/618 |
| 6,436,822 B1 | * | 8/2002 | Towle | 438/681 |
| 6,482,754 B1 | * | 11/2002 | Andideh et al. | 438/780 |
| 6,541,397 B1 | * | 4/2003 | Bencher | 438/780 |
| 6,610,362 B1 | * | 8/2003 | Towle | 427/255.23 |
| 6,627,532 B1 | * | 9/2003 | Gaillard et al. | 438/623 |
| 6,784,119 B2 | * | 8/2004 | Gaillard et al. | 438/780 |
| 6,790,788 B2 | * | 9/2004 | Li et al. | 438/778 |
| 6,797,643 B2 | * | 9/2004 | Rocha-Alvarez et al. | 438/758 |
| 2003/0003768 A1 | * | 1/2003 | Cho et al. | 438/778 |
| 2003/0162410 A1 | * | 8/2003 | Huang et al. | 438/780 |
| 2005/0023694 A1 | * | 2/2005 | Bjorkman et al. | 257/758 |

FOREIGN PATENT DOCUMENTS

JP    11-87503    3/1999

* cited by examiner

Primary Examiner—Anh Duy Mai
(74) Attorney, Agent, or Firm—McDermott Will & Emery LLP

(57) ABSTRACT

A hole is formed in an insulating film containing silicon and carbon. The insulating film has a density or a carbon concentration varying gradually in the direction of the thickness thereof.

14 Claims, 10 Drawing Sheets

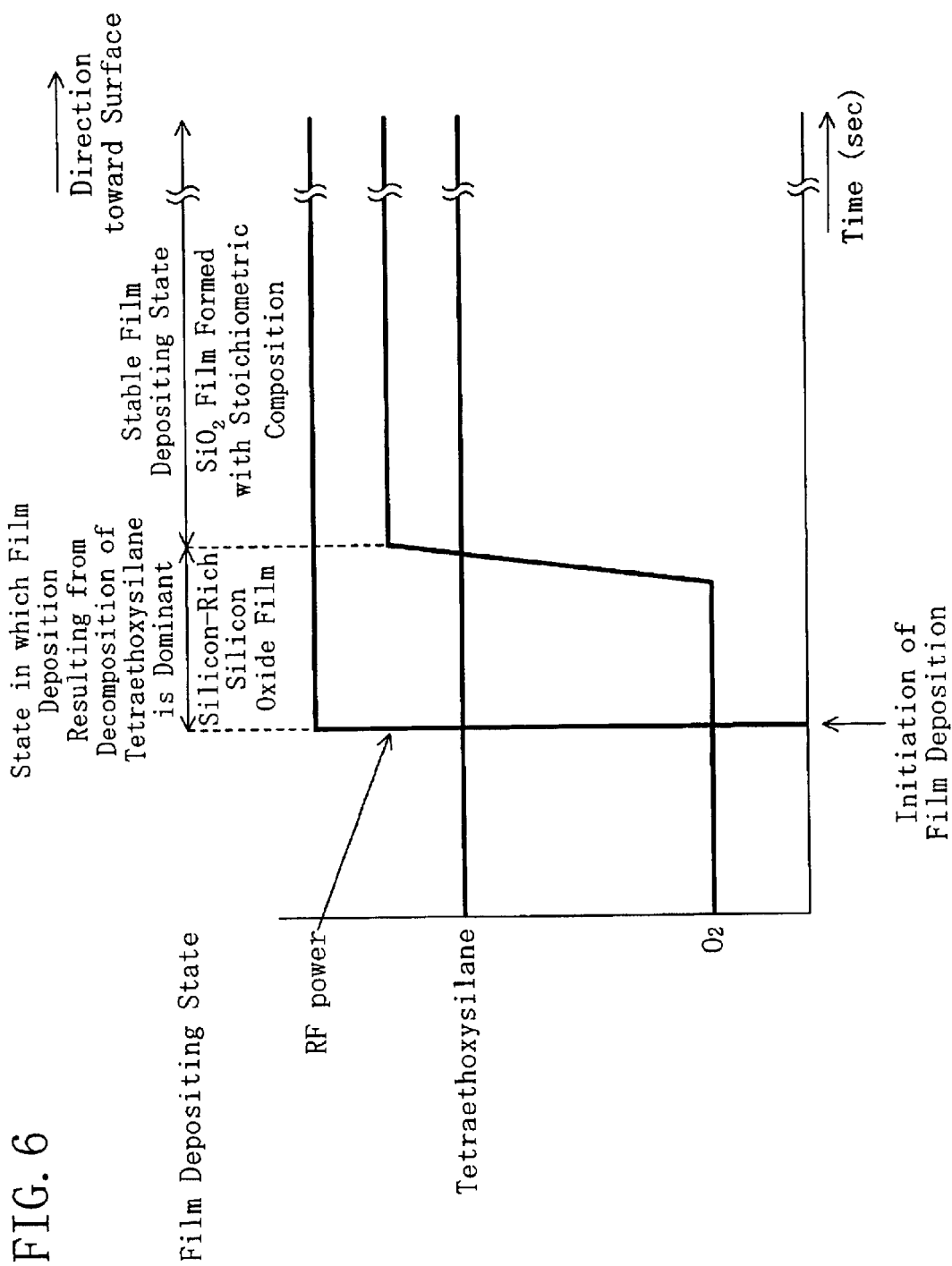

ELECTRONIC DEVICE INCLUDES AN INSULATING FILM HAVING DENSITY OR CARBON CONCENTRATION VARYING GRADUALLY IN THE DIRECTION OF THE THICKNESS AND A CONDUCTIVE FILM FORMED THEREIN

BACKGROUND OF THE INVENTION

The present invention relates to an electronic device and to a method for fabricating the same. More particularly, it relates to wire forming technology.

With the recent trend toward higher integration of an integrated circuit, a wire-to-wire spacing has been reduced so that an electrical parasitic capacitance occurring between wires has been increased. However, the electrical parasitic capacitance between wires should be reduced in the integrated circuit of which a high-speed operation is required.

To reduce the electrical parasitic capacitance between wires, a method which reduces the relative dielectric constant of an insulating film formed between wires (hereinafter referred to as an inter-wire insulating film) is used at present. As a conventional inter-wire insulating film, a silicon oxide film (with a relative dielectric constant of 3.9 to 4.2) has been used frequently. In some integrated circuits, a fluorine-containing silicon oxide film (with a relative dielectric constant of 3.5 to 3.8) lower in relative dielectric constant than the conventional silicon oxide film has been used as an inter-wire insulating film. There has also been proposed a method which uses a carbon-containing silicon oxide film as an inter-wire insulating film as a method for maximally reducing the electrical parasitic capacitance between wires.

In the carbon-containing silicon oxide film, carbon exists in the form of an alkyl group or a phenyl group having a large volume. This reduces the density (1.0 to 1.3 $g/cm^3$) of the carbon-containing silicon oxide film to a value lower than the density (2.3 $g/cm^3$) of a silicon oxide film and also reduces the relative dielectric constant (about 2.0 to 3.0) of the carbon-containing silicon oxide film to a value lower than the relative dielectric constant (3.9 to 4.3) of the silicon oxide film. For example, a relative dielectric constant of about 2.8 can be achieved with a carbon-containing silicon oxide film having a density of about 1.3 $g/cm^3$ and an in-film carbon concentration of about 20 at %.

FIG. 8 is a view showing a wiring structure in a conventional electronic device using a carbon-containing silicon oxide film as an inter-wire insulating film (see Japanese Laid-Open Patent Publication No. HEI 11-87503 (Paragraph Nos. 0015 to 0034)).

As shown in FIG. 8, lower-layer metal wires 4 each composed of a first tantalum nitride film 2 and a first copper film 3 are formed in a first insulating film 1 composed of a silicon oxide film formed on a silicon substrate (not shown). A second insulating film 5 composed of a silicon carbide film is formed over the lower-layer metal wires 4 and the first insulating film 1. A third insulating film 6 composed of a carbon-containing silicon oxide film is formed on the second insulating film 5. The third insulating film 6 has a damaged layer 6a formed by reforming a surface portion of the third insulating film 6. A fourth insulating film 7 is formed on the third insulating film 6. A via hole 8 reaching the lower-layer metal wire 4 and wiring grooves 9 for upper-layer wires are formed in each of the third and fourth insulating films 6 and 7. A plug 12 composed of a second tantalum nitride film 10 and a second copper film 11 is formed in the via hole 8. An upper-layer metal wire 13 composed also of the second tantalum nitride film 10 and the second copper film 11 is formed in each of the wiring grooves 9.

However, the foregoing conventional electronic device has the problem of, e.g., a defective wiring structure, specifically the problem that the upper-layer metal wires 13 are not formed in connected relation to the plug 12, i.e., the problem that the wiring grooves 9 are not formed in connected relation to the via hole 8.

SUMMARY OF THE INVENTION

In view of the foregoing, it is therefore an object of the present invention to prevent a defective wiring structure or the like in an electronic device using a carbon-containing silicon oxide film as an inter-wire insulating film.

To attain the object, the present inventors have examined the cause of the defective wiring structure mentioned above in a conventional electronic device using a conventional carbon-containing silicon oxide film as an inter-wire insulating film. A description will be given herein below to the result of the examination.

FIGS. 9A to 9D and FIGS. 10A to 10C are cross-sectional views illustrating the individual process steps of a method for fabricating the conventional electronic device using a conventional carbon-containing silicon oxide film as an inter-wire insulating film. In FIGS. 9A to 9D and FIGS. 10A to 10C, the same members as used in the conventional electronic device shown in FIG. 8 are designated by the same reference numerals.

First, as shown in FIG. 9A, a resist film (not shown) having openings corresponding to lower-layer wire formation regions is formed by photolithography on a first insulating film 1 composed of a silicon oxide film formed on a silicon substrate (not shown). Then, dry etching is performed with respect to the first insulating film 1 by using the resist film as a mask to form wiring grooves for lower-layer wires. Thereafter, the first tantalum nitride film 2 and the first copper film 3 are deposited successively to completely fill the wiring grooves. Then, the respective portions of the first tantalum nitride film 2 and the first copper film 3 located outside the wiring grooves are removed by CMP (Chemical Mechanical Polishing) so that the lower-layer metal wires 4 are formed.

Next, as shown in FIG. 9B, the second insulating film 5 composed of a silicon carbide film with a thickness of 50 nm is deposited over the first insulating film 1 and the lower-layer metal wires 4. Subsequently, the third insulating film 6 composed of a carbon-containing silicon oxide film with a thickness of 500 nm is deposited on the second insulating film 5. It is to be noted that a typical method for forming a carbon-containing silicon oxide film uses a raw material not containing nitrogen. Specific representatives of the method for forming a carbon-containing silicon oxide film include a method which deposits a film by plasma CVD (Chemical Vapor Deposition) in the presence of alkyl silane and an oxidizer such as $O_2$ or $CO_2$ or a method which deposits a film by plasma CVD in the presence of alkylsiloxane and He or the like.

As described above, however, a carbon-containing silicon oxide film is lower in density than a conventional insulating film used between wires, e.g., a silicon oxide film or the like. This causes the problem that, if the carbon-containing silicon oxide film is exposed to an atmosphere, nitrogen and like present in the atmosphere is absorbed in the film.

Next, as shown in FIG. 9C, the fourth insulating film 7 composed of a silicon oxide film with a thickness of 50 nm is deposited by plasma CVD on the third insulating film 6. The reason for forming the fourth insulating film 7 is as follows: Since the third insulating film 6 composed of the carbon-containing silicon oxide film is low in mechanical strength, it is necessary to cap the third insulating film 6 with a film high in mechanical strength for the prevention of the destruction of the third insulating film 6 in performing the CMP step which causes physical damage (see FIG. 10C). Since it is necessary to lower a processing temperature and reduce a thermal load in each of the steps after wire formation, plasma CVD is used normally as a method for forming the fourth insulating film 7.

However, the third insulating film 6 composed of a carbon-containing silicon oxide film has a surface thereof damaged by a plasma during the deposition of the fourth insulating film 7 by plasma CVD so that the damaged layer 6a is formed in the surface portion of the third insulating film 6. Because of its low density, the third insulating film 6, i.e., the carbon-containing silicon oxide film is prone to plasma damage. If the carbon-containing silicon oxide film is damaged by the plasma, an Si—O—$CH_3$ bond or an Si—$CH_3$ bond in the film is broken so that a basic material such as $OH^-$ or $CH_3^-$ is formed. If nitrogen is contained in the carbon-containing silicon oxide film or in the plasma atmosphere when the carbon-containing silicon oxide film is damaged by the plasma, methylamine (monomethylamine: $NH_2CH_3$, dimethylamine: $NH(CH_3)_2$, or trimethylamine: $N(CH_3)_3$), which is a base, is formed. The damaged layer 6a formed by the plasma in the carbon-containing silicon oxide film is a hydrophilic film and functions as a layer for promoting the diffusion of the amine resulting from nitrogen present in the carbon-containing silicon oxide film (the third insulating film 6).

Next, a resist film (not shown) having an opening corresponding to a via hole formation region is formed by photolithography on the fourth insulating film 7. Then, dry etching is performed with respect to the fourth, third, and second insulating films 7, 6, and 5 to form the via hole 8 such that the surface of the lower-layer metal wire 4 is exposed therein, as shown in FIG. 9D. The via hole 8 is formed to provide electrical connection between the lower-layer metal wire 4 and a metal wire formed thereon as the upper-layer wire.

To form a wiring groove for upper-layer wire, an acrylic chemically amplified photoresist is coated on the fourth insulating film 7 formed with the via hole 8, the chemically amplified photoresist is exposed to light having a wavelength of 193 nm such that a desired wiring groove pattern (opening pattern) is formed. During the exposure, an acid generating agent contained in the chemically amplified resist generates an acid under the irradiation of the light. The generated acid reacts with an acrylic resin which is a main raw material of the resist so that the structure of the acrylic resin is changed into a structure soluble in a developer. Since an acid as a reaction product is generated resultingly during the reaction between the acrylic resin and the acid, a reaction which changes the structure of the acrylic resin into the structure soluble in the developer proceeds continuously. By developing the photoresist after the exposure, therefore, a resist film 14 having openings 14a corresponding to the wiring groove formation regions is formed on the fourth insulating film 7, as shown in FIG. 10A.

However, an incomplete opening 14b is formed disadvantageously in the upper portion of the resist film 14 located over the via hole 8. In other words, the portion of the photoresist located adjacent to the via hole 8 cannot be developed satisfactorily. As a result, a desired wiring groove pattern cannot be formed in the region formed with the via hole 8 because the resist remains in or over the via hole 8, though the region formed with the via hole 8 is a wiring groove formation region. The reason for this may be as follows: The amine contained in the third insulating film (the carbon-containing silicon oxide film) 6 formed under the fourth insulating film 7 passes through the via hole 8 to be diffused into the photoresist. On the other hand, the basic material and the like contained in the damaged layer 6a formed by the plasma in the carbon-containing silicon oxide film 6 are diffused into the photoresist through the via hole 8. As a result, a resist poisoning phenomenon arises in which the concentration of the base in the resist is increased. The basic material and the like diffused into the photoresist through the via hole 8 neutralize the acid generated from an acid generating material in the resist during the exposure of the resist for forming the wiring groove pattern. This prevents chain reactions of acid generation from proceeding in the acrylic chemically amplified resist so that defective development as described above occurs. The defective development occurs conspicuously in the vicinity of the via hole 8 for the following reason. Since the density of the silicon oxide film composing the fourth insulating film 7 is as high as 2.3 $g/cm^3$, it become difficult for the amine and the basic material to be diffused into the fourth insulating film 7 so that the amine and the basic material come out mainly of the via hole 8, which is also the opening in the fourth insulating film 7.

Then, dry etching is performed with respect to the fourth insulating film 7 and the third insulating film 6 by using the resist film 14 as a mask, thereby forming the wiring grooves 9, as shown in FIG. 10B. However, since only the incomplete opening 14b has been formed in the portion of the resist film 14 located over the via hole 8 as a result of the defective development (see FIG. 10A) and therefore the resist remains in and over the via hole 8, the wiring grooves 9 cannot be formed in connected relation to the via hole 8.

Next, the resist film 14 is removed and the substrate is cleaned. Then, the second tantalum nitride film 10 and the second copper film 11 are deposited successively to completely fill each of the via hole 8 and the wiring grooves 9. Thereafter, the respective portions of the second tantalum nitride film 10 and the second copper film 11 located outside the via hole 8 and outside the wiring grooves 9 are removed by CMP, whereby the plug 12 composed of the second tantalum nitride film 10 and the second copper film 11 in connected relation to the lower-layer metal wire 4 is formed. On the other hand, the upper-layer metal wires 13 each composed of the second tantalum nitride film 10 and the second copper film 11 are formed in the wiring grooves 9. However, since the upper-layer metal wires 13 are not formed in connected relation to the plug 12, an electronic device with a defective metal wiring structure is formed disadvantageously.

As a result of the examination, the present inventors have found that the diffusion of the basic material and the like into the resist through the hole formed in the carbon-containing silicon oxide films is the specific cause of the defective development (i.e., defective patterning) and that the defective development is the cause of the defective wiring structure and obtained, from the findings, ideas forming the basis for the present invention One of the ideas obtained by the present inventors is the adjustment of the density of the uppermost portion of the carbon-containing silicon oxide film to be higher than the average density of the entire film. By increasing the density of the uppermost portion of the carbon-containing silicon oxide film, the degree of damage or destruction undergone by the carbon-containing silicon oxide film when different types of films are formed on the carbon-containing silicon oxide film can be reduced and the generation of the basic material can be suppressed thereby. By increasing the density of the uppermost portion of the carbon-containing silicon oxide film, it is also possible to suppress the absorption of nitrogen from an atmosphere into the carbon-containing silicon oxide film. This suppresses the diffusion of nitrogen and the basic material from the carbon-containing silicon oxide film into the resist through the via hole and thereby prevents the neutralization of an acid generated from an acid generating material contained in the resist by the basic material and the like during exposure. As a consequence, chain reactions of acid generation in the chemically amplified resist do not halt so that the remaining of the resist in and over the via hole as a result of the defective development, i.e., defective patterning of the resist in the vicinity of the via hole is prevented. In other words, a desired wiring groove pattern can be formed even in the vicinity of the via hole so that the lower-layer wire and the upper-layer wire are connected reliably to each other and the formation of a defective wiring structure is prevented even when the carbon-containing silicon oxide film is used as an inter-wire insulating film. Specifically, the foregoing effects were achieved by adjusting to 1.8 g/cm$^3$, the density of the uppermost portion having a thickness of about 10 nm of a carbon-containing silicon oxide film having a thickness of several hundreds of nanometers and an average density of 1.3 g/cm$^3$.

In addition, the present inventors have found that the same effects as achieved by "adjusting the density of the uppermost portion of the carbon-containing silicon oxide film to be higher than the average density of the entire film" is also achievable by adjusting the carbon concentration of the uppermost portion of the carbon-containing silicon oxide film to be higher than the average carbon concentration of the entire film. Specifically, the foregoing effects were achieved by adjusting, to 30 at %, the carbon concentration of the uppermost portion having a thickness of about 10 nm of a carbon-containing silicon oxide film having a thickness of several hundreds of nanometers and an average carbon concentration of 20 at %. In this case, the uppermost portion of the carbon-containing silicon oxide film may also be a silicon carbide film containing substantially no oxygen.

The present inventors have also found that the diffusion of nitrogen or a basic material from an insulating film or the like formed below the carbon-containing silicon oxide film into the carbon-containing silicon oxide film can be suppressed by increasing the density or carbon concentration of the lowermost portion of the carbon-containing silicon oxide film to be higher than the average density or average carbon concentration of the entire film. This prevents defective patterning of the chemically amplified resist in the vicinity of a via hole formed in the carbon-containing silicon oxide film and thereby prevents a defective wiring structure. This is particularly effective when an insulating film containing nitrogen is formed between the carbon-containing silicon oxide film and lower-layer wires formed thereunder. Specifically, the foregoing effects were achieved by adjusting, to 1.8 g/cm$^3$, the density of the lowermost portion having a thickness of about 10 nm of a carbon-containing silicon oxide film having a thickness of several hundreds of nanometers and an average density of 1.3 g/cm$^3$. The foregoing effects were also achieved by adjusting, to 30 at %, the carbon concentration of the lowermost portion having a thickness of about 10 nm of a carbon-containing silicon oxide film having a thickness of several hundreds of nanometers and an average carbon concentration of 20 at %. In the case of adjusting the carbon concentration of the lowermost portion of the carbon-containing silicon oxide film to be higher than the average carbon concentration of the entire film, the lowermost portion of the carbon-containing silicon oxide film may be a silicon carbide film containing substantially no oxygen.

As a method for forming a carbon-containing silicon oxide film having an uppermost portion with a density higher than the average density of the entire film, the present inventors have examined the following several methods.

In accordance with the first method, the present inventors tried forming a carbon-containing silicon oxide film by plasma CVD and then forming another carbon-containing silicon oxide film higher in density than the previously formed carbon-containing silicon oxide film in an incontinuous manner, i.e., without continuing a plasma discharge. In accordance with the method, however, the previously formed carbon-containing silicon oxide film (lower layer) was damaged by an initial discharge in forming the other carbon-containing silicon oxide film (upper layer) and hence the generation of a basic material and the like which cause defective patterning was not suppressed. The same problem was encountered even when a carbon-containing silicon oxide film having an uppermost portion with a carbon concentration higher than the average carbon concentration of the entire film was formed by a similar method.

In accordance with the second method, the present inventors then tried forming a carbon-containing silicon oxide film, performing surface reformation with respect to the carbon-containing silicon oxide film by using a plasma of He gas, Ar gas, O$_2$ gas, NH$_3$ gas, or like gas at a high temperature of about 400° C., and thereby increasing the density of the surface portion of the carbon-containing silicon oxide film. In accordance with the method, however, an Si—O—CH$_3$ bond or an Si—CH$_3$ bond in the carbon-containing silicon oxide film formed once was destroyed and a basic material such as OH$^-$ or CH$_3^-$ was formed consequently so that defective patterning of the chemically amplified resist was not prevented. The same problem was encountered when a carbon-containing silicon oxide film having an uppermost portion with a carbon concentration higher than the average carbon concentration of the entire film was formed by a similar method.

In short, the present inventors have found that, if the density of the uppermost or lowermost portion of the carbon-containing silicon oxide film is adjusted to be higher than the average density of the entire film, the density of the carbon-containing silicon oxide film should be varied gradually in the direction of the thickness thereof. Likewise, the present inventors have found that, if the carbon concentration of the uppermost or lowermost portion of the carbon-containing silicon oxide film is adjusted to be higher than the average carbon concentration of the entire film, the carbon concentration of the carbon-containing silicon oxide film should be varied gradually in the direction of the thickness thereof.

The present invention has been achieved based on the foregoing findings. Specifically, a first electronic device according to the present invention comprises: a first insulating film containing silicon and carbon; and a hole formed in the first insulating film, the first insulating film having a density varying gradually in a direction of a thickness thereof.

In the first electronic device, the density of the first insulating film containing silicon and carbon (hereinafter referred to as a carbon-containing insulating film) varies gradually in the direction of the thickness thereof. The arrangement reduces, if an insulating film or the like is formed on the carbon-containing insulating film, the degree of damage or destruction undergone by the carbon-containing insulating film by adjusting, e.g., the density of the uppermost portion of the carbon-containing insulating film to be higher than the average density of the entire film and thereby suppresses the generation of a basic material. If the density of the uppermost portion of the carbon-containing insulating film is high, the absorption of nitrogen from an atmosphere into the carbon-containing insulating film can also be suppressed. By further adjusting, e.g., the density of the lowermost portion of the carbon-containing insulating film to be higher than the average density of the entire film, the diffusion of nitrogen or a basic material from an insulating film or the like formed below the carbon-containing insulating film into the carbon-containing insulating film can be suppressed.

Thus, the first electronic device can suppress the diffusion of nitrogen or a basic material from the carbon-containing insulating film into a resist through the hole in, e.g., a photolithographic step for forming a wiring groove connecting to the hole or the like in the carbon-containing insulating film. Consequently, an acid generated from an acid generating material in the resist upon exposure is prevented from being neutralized by a basic material and the like. As a result, chain reactions of acid generation in a chemically amplified resist do not halt so that the remaining of the resist in and over the hole as a result of defective development, i.e., defective patterning of the resist in the vicinity of the hole is prevented. Specifically, since a desired wiring groove pattern, e.g., can be formed even in the vicinity of the hole, a defective wiring structure that has been formed conventionally when a carbon-containing insulating film is used as an inter-wire insulating film can be prevented so that an electronic device with a highly reliable wiring structure and with a small parasitic capacitance between wires is implemented.

In the first electronic device, if an uppermost or lowermost portion of the first insulating film has a density higher than an average density of the first insulating film, preferably a density of 1.8 g/cm$^3$ or more, and the average density is 1.4 g/cm$^3$ or less, the foregoing effect is achieved reliably.

A second electronic device according to the present invention comprises: a first insulating film containing silicon and carbon; and a hole formed in the first insulating film, the first insulating film having a carbon concentration varying gradually in a direction of a thickness thereof.

In the second electronic device, the carbon concentration of the first insulating film containing silicon and carbon (i.e., a carbon-containing insulating film) varies gradually in the direction of the thickness thereof. The arrangement reduces, if an insulating film or the like is formed on the carbon-containing insulating film, the degree of damage or destruction undergone by the carbon-containing insulating film by adjusting, e.g., the carbon concentration of the uppermost portion of the carbon-containing insulating film to be higher than the average carbon concentration of the entire film and thereby suppresses the generation of a basic material. If the carbon concentration of the uppermost portion of the carbon-containing insulating film is high, the absorption of nitrogen from an atmosphere into the carbon-containing insulating film can also be suppressed. By further adjusting, e.g., the carbon concentration of the lowermost portion of the carbon-containing insulating film to be higher than the average carbon concentration of the entire film, the diffusion of nitrogen or a basic material from an insulating film or the like formed below the carbon-containing insulating film into the carbon-containing insulating film can further be suppressed.

Thus, the second electronic device can suppress the diffusion of nitrogen or a basic material from the carbon-containing insulating film into a resist through the hole in, e.g., a photolithographic step for forming a wiring groove connecting to the hole or the like in the carbon-containing insulating film. Consequently, an acid generated from an acid generating material in the resist upon exposure is prevented from being neutralized by a basic material and the like. As a result, chain reactions of acid generation in a chemically amplified resist do not halt so that the remaining of the resist in and over the hole as a result of defective development, i.e., defective patterning of the resist in the vicinity of the hole is prevented. Specifically, since a desired wiring groove pattern, e.g., can be formed even in the vicinity of the hole, a defective wiring structure that has been formed conventionally when a carbon-containing insulating film is used as an inter-wire insulating film can be prevented so that an electronic device with a highly reliable wiring structure and with a small parasitic capacitance between wires is implemented.

In the second electronic device, if an uppermost or lowermost portion of the first insulating film has a carbon concentration higher than an average carbon concentration of the first insulating film, preferably a carbon concentration of 30 at % or more, and the average carbon concentration is 20 at % or less, the foregoing effect is achieved reliably.

Preferably, the first or second electronic device further comprises: a second insulating film formed on the first insulating film, wherein an average density of the second insulating film is 1.5 g/cm$^3$ or more and 1.7 g/cm$^3$ or less.

In the arrangement, the basic material and the like in the first insulating film (carbon-containing insulating film) is more likely to be diffused in the second insulating film. If the total amount of the basic material and the like generated in the carbon-containing insulating film is assumed to be the same, the localized diffusion of the basic material and the like into the hole in the carbon-containing insulating film is suppressed more reliably than in the case where an insulating film having a density over 1.7 g/cm$^3$ is provided on the carbon-containing insulating film. Accordingly, defective patterning of the resist in the vicinity of the hole can be prevented more reliably.

Preferably, the first or second electronic device further comprises: a second insulating film formed on the first insulating film, wherein an abundance ratio of oxygen to silicon each contained in a portion of the second insulating film located adjacent to the first insulating film is less than 2.

The arrangement allows, if the second insulating film is deposited by plasma CVD, the step of depositing the second insulating film to be performed in an oxygen lacking state during the initial period thereof. Since oxygen ions or oxygen radicals which induce plasma damage to the carbon-containing insulating film can be reduced during the initial period of the deposition of the second insulating film, the degree of damage or destruction undergone by the carbon-containing insulating film can be reduced more reliably. In this case, since a silicon-rich insulating film is formed during the initial period of the deposition of the second insulating film, damage induced by the plasma in the carbon-containing insulating film if the deposition of the second insulating film is performed continuedly can be prevented more reliably.

A first method for fabricating an electronic device according to the present invention comprises the steps of: forming a second insulating film on a first insulating film containing silicon and carbon; forming a hole in each of the second and first insulating films; forming, on the second insulating film formed with the hole, a resist film having an opening corresponding to a specified region including a region formed with the hole; and etching each of the second and first insulating films by using the resist film as a mask to form a depressed portion connecting to the hole, the first insulating film having a density varying gradually in a direction of a thickness thereof.

In the first method for fabricating an electronic device, the density of the first insulating film containing silicon and carbon (i.e., a carbon-containing insulating film) varies gradually in the direction of the thickness thereof. The arrangement reduces, when the second insulating film is formed on the carbon-containing insulating film, the degree of damage or destruction undergone by the carbon-containing insulating film by adjusting, e.g., the density of the uppermost portion of the carbon-containing insulating film to be higher than the average density of the entire film and thereby suppresses the generation of a basic material. If the density of the uppermost portion of the carbon-containing insulating film is high, the absorption of nitrogen from an atmosphere into the carbon-containing insulating film can also be suppressed. By further adjusting, e.g., the density of the lowermost portion of the carbon-containing insulating film to be higher than the average density of the entire film, the diffusion of nitrogen or a basic material from an insulating film or the like formed below the carbon-containing insulating film into the carbon-containing insulating film can be suppressed.

Thus, the first method for fabricating an electronic device achieves the following effect if a photolithographic step for forming a depressed portion connecting to the hole in the carbon-containing insulating film is performed continuously and subsequently to the formation of the carbon-containing insulating film. That is, since the diffusion of nitrogen and a basic material from the carbon-containing insulating film into the resist through the hole can be suppressed, an acid generated from an acid generating material in the resist upon exposure is prevented from being neutralized by the basic material and the like. As a result, chain reactions of acid generation in a chemically amplified resist do not halt so that the remaining of the resist in and over the hole as a result of defective development, i.e., defective patterning of the resist in the vicinity of the hole is prevented. Specifically, since a desired wiring groove pattern, e.g., can be formed even in the vicinity of the hole, a defective wiring structure that has been formed conventionally when a carbon-containing insulating film is used as an inter-wire insulating film can be prevented so that an electronic device with a highly reliable wiring structure and with a small parasitic capacitance between wires is implemented.

A second method for forming an electronic device according to the present invention comprises the steps of: forming a second insulating film on a first insulating film containing silicon and carbon; forming a hole in each of the second and first insulating films; forming, on the second insulating film formed with the hole, a resist film having an opening corresponding to a specified region including a region formed with the hole; and etching each of the second and first insulating films by using the resist film as a mask to form a depressed portion connecting to the hole, the first insulating film having a carbon concentration varying gradually in a direction of a thickness thereof.

In the second method for fabricating an electronic device, the carbon concentration of the first insulating film containing silicon and carbon (i.e., a carbon-containing insulating film) varies gradually in the direction of the thickness thereof. The arrangement reduces, when the second insulating film is formed on the carbon-containing insulating film, the degree of damage or destruction undergone by the carbon-containing insulating film by adjusting, e.g., the carbon concentration of the uppermost portion of the carbon-containing insulating film to be higher than the average carbon concentration of the entire film and thereby suppresses the generation of a basic material. If the carbon concentration of the uppermost portion of the carbon-containing insulating film is high, the absorption of nitrogen from an atmosphere into the carbon-containing insulating film can also be suppressed. By further adjusting, e.g., the carbon concentration of the lowermost portion of the carbon-containing insulating film to be higher than the average carbon concentration of the entire film, the diffusion of nitrogen or a basic material from an insulating film or the like formed below the carbon-containing insulating film into the carbon-containing insulating film can be suppressed.

Thus, the second method for fabricating an electronic device achieves the following effect if a photolithographic step for forming a depressed portion connecting to the hole in the carbon-containing insulating film is performed continuously and subsequently to the formation of the carbon-containing insulating film. That is, since the diffusion of nitrogen or a basic material from the carbon-containing insulating film into the resist through the hole can be suppressed, an acid generated from an acid generating material in the resist upon exposure is prevented from being neutralized by the basic material and the like. As a result, chain reactions of acid generation in a chemically amplified resist do not halt so that the remaining of the resist in and over the hole as a result of defective development, i.e., defective patterning of the resist in the vicinity of the hole is prevented. Specifically, since a desired wiring groove pattern, e.g., can be formed even in the vicinity of the hole, a defective wiring structure that has been formed conventionally when a carbon-containing insulating film is used as an inter-wire insulating film can be prevented so that an electronic device with a highly reliable wiring structure and with a small parasitic capacitance between wires is implemented.

In the first or second method for fabricating an electronic device, the step of forming the second insulating film preferably includes the step of depositing the second insulating film by plasma CVD using at least a silicon supply gas and an oxygen supply gas and a flow rate of the oxygen supply gas is preferably controlled to be lower at an initial period of the deposition of the second insulating film such that an abundance ratio of oxygen to silicon each contained in a portion of the second insulating film adjacent to the first insulating film is less than 2.

The arrangement performs the step of depositing the second insulating film in an oxygen lacking state during the initial period thereof so that oxygen ions or oxygen radicals which induce plasma damage in the carbon-containing insulating film can be reduced and the degree of damage or destruction undergone by the carbon-containing insulating film is reduced more reliably. In this case, since a silicon-rich insulating film is formed during the initial period of the deposition of the second insulating film, damage induced by a plasma in the carbon-containing insulating film when the deposition of the second insulating film is performed continuously can be prevented more reliably.

In the first or second method for fabricating an electronic device, the step of forming the second insulating film is preferably performed while preventing the first insulating film from being exposed to an atmosphere containing nitrogen.

The arrangement minimizes an amount of nitrogen absorbed in the first insulating film, i.e., the carbon-containing insulating film and thereby suppresses a reaction between a methyl group or the like formed in the carbon-containing insulating film and nitrogen. Consequently, the formation of a basic material, such as amine, in a large amount in the carbon-containing insulating can be prevented.

In the first or second method for fabricating an electronic device, the step of forming the second insulating film is preferably performed by spin coating or by thermal CVD.

This more reliably prevents a plasma damage to the carbon containing insulating film compared with the case where the second insulating film is formed by plasma CVD.

Preferably, the first or second method for fabricating an electronic device further comprises, between the step of forming the hole and the step of forming the resist film, the step of forming a dummy plug in the hole.

In the arrangement, the dummy plug is buried in the hole so that the stepped portion of the insulating film serving as the underlie during resist coating is suppressed in a photolithographic step for forming a depressed portion connecting to the hole in the carbon-containing insulating film. Accordingly, the resist can be coated with a higher degree of planarity. As a result, exposure light reliably reaches a deep portion in the resist deposited over the dummy plug in the hole so that the occurrence of unneeded resist residues after development is prevented. In other words, the formation of a trench pattern with high size controllability can be performed. Since the bottom portion of the hole is covered with the dummy plug, the occurrence of damage to the bottom portion of the hole, i.e., to a lower-layer wire or the like can be prevented in the etching step subsequent to the foregoing photolithographic step. Since the wall surface of the hole is covered with the dummy plug, the permeation of amine or the like from the carbon-containing insulating film into the hole, i.e., the occurrence of poisoning can be prevented by using a proper material for the dummy plug, e.g., an organic material or the like.

BRIEF DESCRIPTION OF THE DRAWINGS

FIG. 6 is a view showing main parameters varying with time when a silicon oxide film is formed by using a method for fabricating an electronic device according to a third embodiment of the present invention;

DETAILED DESCRIPTION OF THE INVENTION

Embodiment 1

An electronic device according to a first embodiment of the present invention and a method for fabricating the same will be described herein below with reference to the drawings.

Figure 1:
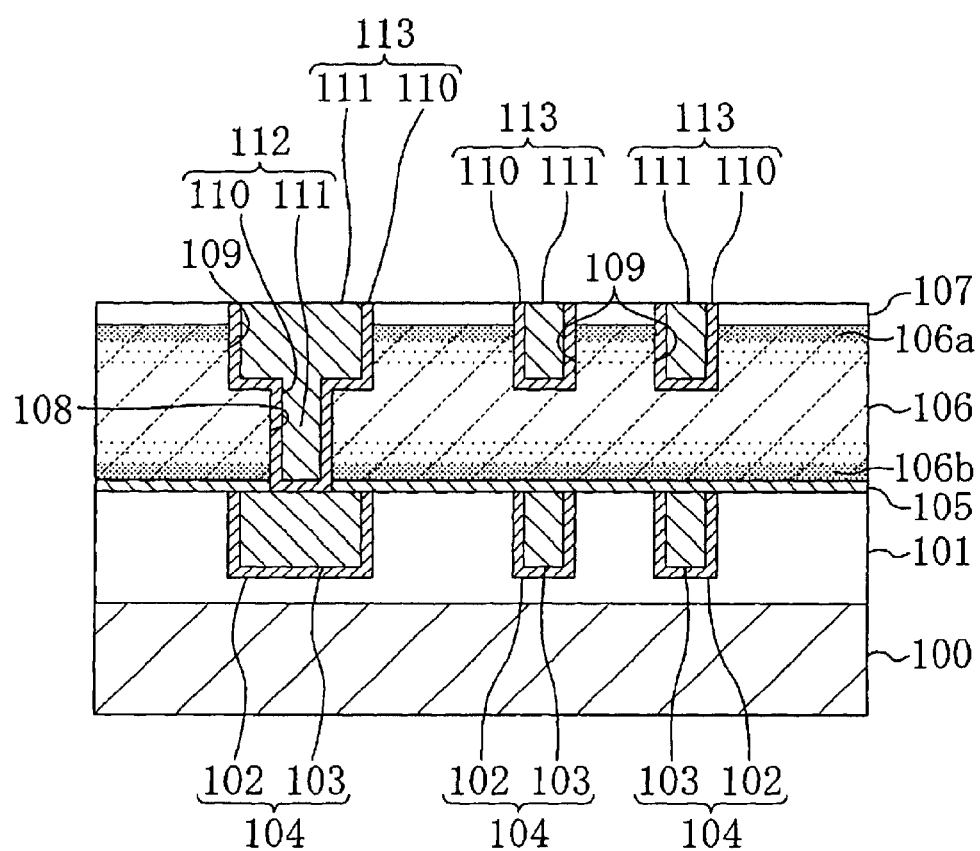
FIG. 1 is a cross-sectional view of an electronic device according to a first embodiment of the present invention.

FIG. 1 is a view showing a cross-sectional structure of the electronic device according to the first embodiment.

As shown in FIG. 1, lower-layer metal wires 104 composed of a first tantalum nitride film 102 and a first copper film 103 are formed in a first insulating film 101 composed of a silicon oxide film formed on a substrate 100 made of, e.g., silicon. A second insulating film 105 composed of a silicon carbide film is formed over the lower-layer metal wires 104 and the first insulating film 101. The second insulating film 105 prevents the diffusion of copper atoms contained in the lower-layer metal wires 104 and prevents the oxidation of the lower-layer metal wires 104 in the step of forming an interlayer insulating film and the like over the lower-layer metal wires 104. A third insulating film 106 ("first insulating film" in claims) composed of, e.g., a carbon-containing silicon oxide film is formed on the second insulating film 105. A fourth insulating film 107 ("second insulating film" in claims) composed of, e.g., a silicon oxide film is formed on the third insulating film 106. A via hole 108 reaching the lower-layer metal wire 104 is formed in the second insulating film 105 and in the third insulating film 106 (in the lower portion thereof). A wiring groove (for upper-layer wire) 109 connecting to the via hole 108 is formed in the third insulating film 106 (in the upper portion thereof) and in the fourth insulating film 107. A plug 112 composed of a second tantalum nitride film 110 and a second copper film 111 is formed in the via hole 108. Upper-layer metal wires 113 composed also of the second tantalum nitride film 110 and the second copper film 111 are formed in the wiring grooves 109. The lower-layer metal wire 104 and the upper-layer metal wire 113 are connected to each other via the plug 112.

The present embodiment is characterized in that the density and carbon concentration of the carbon-containing silicon oxide film serving as the third insulating film 106 gradually vary in the direction of the thickness thereof. Specifically, each of the uppermost portion 106a with a thickness of about 10 nm of the third insulating film 106 (having a total thickness of 500 nm) and the lowermost portion 106b with a thickness of about 10 nm of the third insulating film 106 has a density of about 1.8 g/cm$^3$ and a carbon concentration of about 30 at %. The average density and average carbon concentration of the third insulating film 106 are about 1.3 g/cm$^3$ and about 20 at %, respectively. Thus, in the third insulating film 106, the density and the carbon concentration gradually decrease from the lower portion thereof toward the center portion thereof and gradually increase from the center portion thereof toward the upper portion thereof.

A description will be given next to a method for fabricating an electronic device according to the first embodiment with reference to the drawings.

FIGS. 2A to 2D and FIGS. 3A to 3C are cross-sectional views illustrating the individual process steps of the method for fabricating an electronic device according to the first embodiment. In FIGS. 2A to 2D and FIGS. 3A to 3C, the same members as used in the electronic device according to the first embodiment shown in FIG. 1 are designated by the same reference numerals.

Figure 2A:
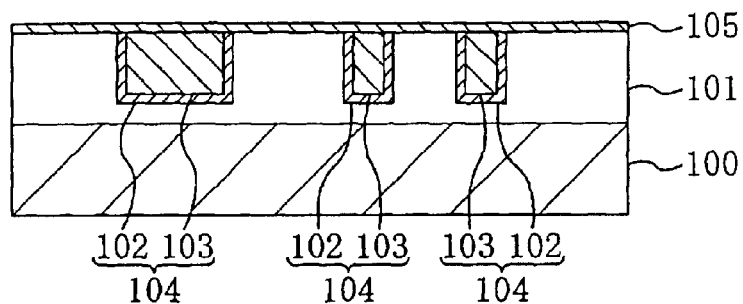
FIGS. 2A to 2D are cross-sectional views illustrating the individual process steps of a method for fabricating an electronic device according to the first embodiment.

First, as shown in FIG. 2A, a resist film (not shown) having openings corresponding to lower-layer wire formation regions are formed by photolithography on the first insulating film 101 composed of the silicon oxide film formed on the substrate 100. Then, dry etching is performed with respect to the first insulating film 101 by using the resist film as a mask, thereby forming the wiring grooves for lower-layer wires. Thereafter, the first tantalum nitride film 102 and the first copper film 103 are deposited successively to completely fill the wiring grooves. Then, the respective portions of the first tantalum nitride film 102 and the first copper film 103 located outside the wiring grooves are removed by CMP so that the lower-layer metal wires 104 are formed. Thereafter, the second insulating film 105 composed of the silicon carbide film with a thickness of about 50 nm is deposited over the first insulating film 101 and the lower-layer metal wires 104.

Figure 2B:
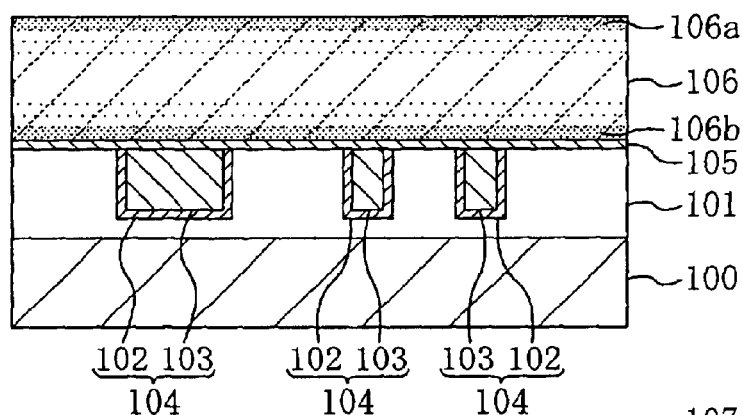

Next, as shown in FIG. 2B, the third insulating film 106 composed of a carbon-containing silicon oxide film with a thickness of about 500 nm, an average density of about 1.3 $g/cm^3$, and an average carbon concentration of about 20 at %, e.g., is formed on the second insulating film 105. As described above, the third insulating film 106 has the uppermost portion 106a (with a thickness of about 10 nm) having a density of about 1.8 $g/cm^3$ and a carbon concentration of about 30 at % and the lowermost portion 106b (with a thickness of about 10 nm) having a density of about 1.8 $g/cm^3$ and a carbon concentration of about 30 at %. Thus, in the third insulating film 106, the density and the carbon concentration gradually decrease from the lower portion thereof toward the center portion thereof and gradually increase from the center portion thereof toward the upper portion thereof.

Figure 2C:
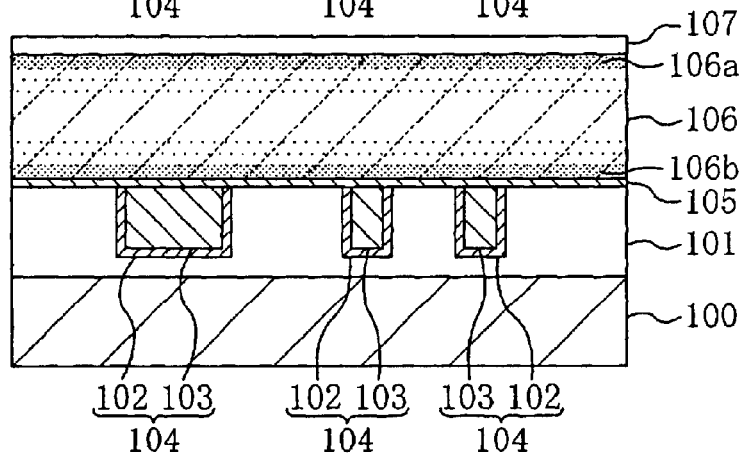

Next, as shown in FIG. 2C, the fourth insulating film 107 composed of, e.g., a silicon oxide film with a thickness of about 50 nm is deposited by plasma CVD on the third insulating film 106. The reason for forming the fourth insulating film 107 is as follows: Since the third insulating film 106 composed of the carbon-containing silicon oxide film is low in mechanical strength, it is necessary to cap the third insulating film 106 with a film high in mechanical strength for the prevention of the destruction of the third insulating film 106 in performing the CMP step which causes physical damage (see FIG. 3C). Since it is necessary to lower a processing temperature and reduce a thermal load in each of the steps after wire formation, plasma CVD is used normally as a method for forming the fourth insulating film 107.

During the deposition of the fourth insulating film 107 by plasma CVD, the third insulating film 106 composed of a carbon-containing silicon oxide film has a surface thereof damaged by a plasma. If the carbon-containing silicon oxide film is damaged by the plasma, an Si—O—$CH_3$ bond or an Si—$CH_3$ bond in the film is broken so that a basic material such as $OH^-$ or $CH_3^-$ is formed. A damaged layer formed by the plasma in the carbon-containing silicon oxide film functions as a layer for promoting the diffusion of amine, which has resulted from nitrogen present in an extremely small amount in the carbon-containing silicon oxide film.

However, since the film density and the carbon concentration are high in the uppermost portion 106a of the third insulating film 106, the third insulating film 106 is hardly damaged by the plasma. This suppresses the generation of the basic material and the like in the surface portion of the third insulating film 106, i.e., the carbon-containing silicon oxide film.

Figure 2D:
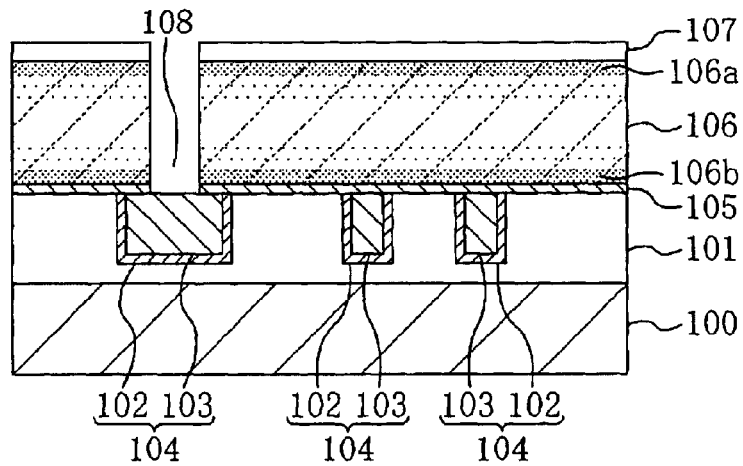

Next, a resist film (not shown) having an opening corresponding to the via hole formation region is formed by photolithography on the fourth insulating film 107. Thereafter, dry etching is performed with respect to the fourth, third, and second insulating films 107, 106, and 105 by using the resist film as a mask, thereby forming a via hole 108 such that the surface of the lower-layer metal wire 104 is exposed therein, as shown in FIG. 2D. The via hole 108 is formed to provide electrical connection between the lower-layer metal wire 104 and a metal wire serving as an upper-layer wire therefor.

Figure 3A:
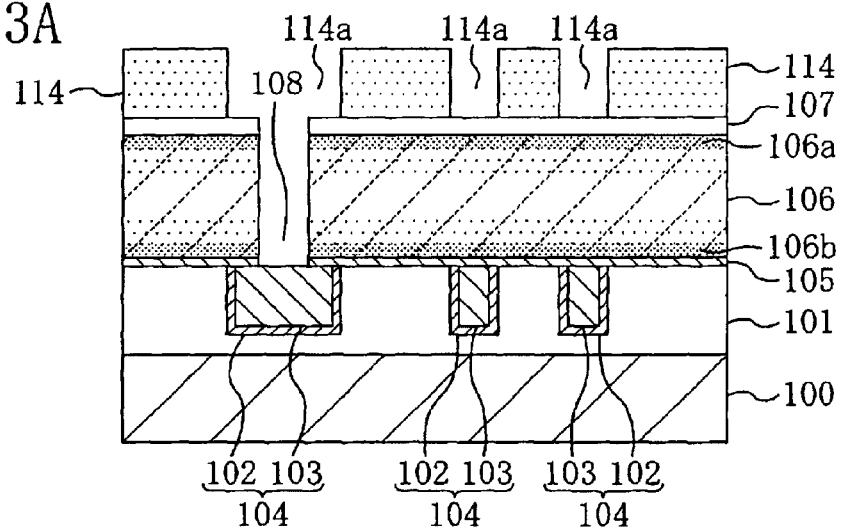
FIGS. 3A to 3C are cross-sectional views illustrating the individual process steps of the method for fabricating an electronic device according to the first embodiment.

Next, an acrylic chemically amplified photoresist is coated on the fourth insulating film 107 formed with the via hole 108 for the formation of the wiring grooves for the upper-layer wires. The coated photoresist is then exposed to light at a wavelength of 193 nm such that a desired wiring groove pattern (opening pattern) is formed. During the exposure, an acid generating material contained in the chemically amplified resist generates an acid under the irradiation of the light. The generated acid reacts with an acrylic resin which is a main raw material of the resist so that the structure of the acrylic resin is changed into a structure soluble in a developer. Since the acid as a reaction product is generated resultingly during the reaction between the acrylic resin and the acid, a reaction which changes the structure of the acrylic resin into a structure soluble in the developer proceeds continuously in the exposed portion of the photoresist. By developing the photoresist after the exposure, therefore, a resist film 114 having openings 114a corresponding to wiring groove formation regions is formed on the fourth insulating film 107, as shown in FIG. 3A. The regions formed with the openings 114a include the region formed with the via hole 108.

Since the basic material is not diffused from the lower-layer films including the third insulating film 106 into the photoresist through the via hole 108 in the present embodiment, the resist is prevented from remaining in and over the via hole 108 as a result of the defective development.

Figure 3B:
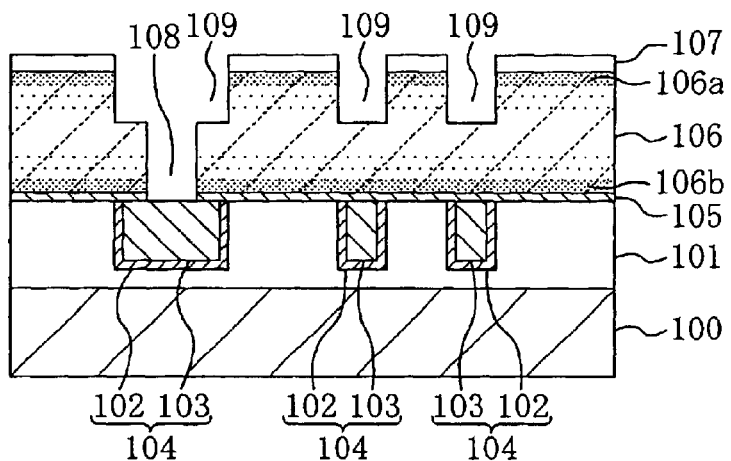

Next, dry etching is performed with respect to the fourth and third insulating films 107 and 106 by using the resist film 114 as a mask, thereby forming the wiring grooves 109, as shown in FIG. 3B. Since the opening 114a in the resist film 114 is formed precisely even over the via hole 108, the wiring groove 109 can be formed in connected relation to the via hole 108.

Figure 3C:
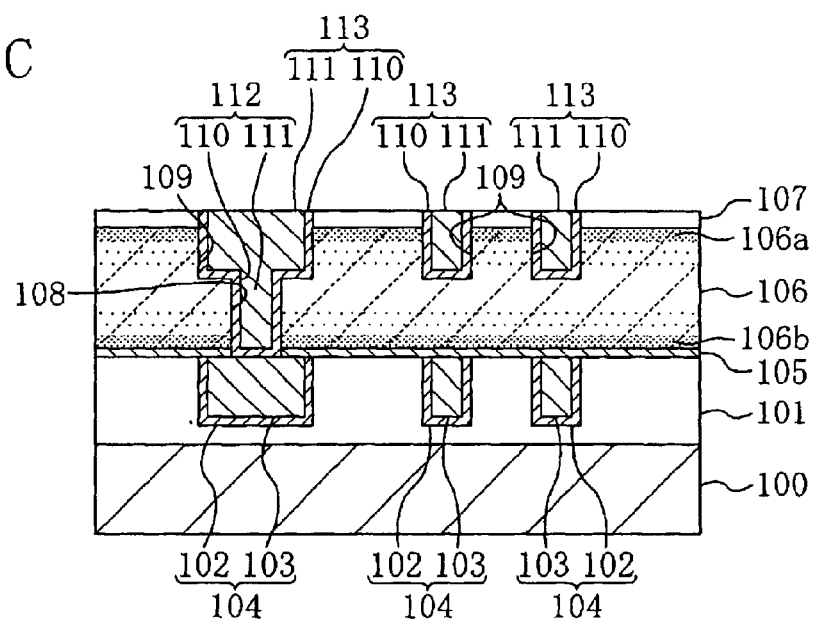

Next, the resist film 114 is removed and the substrate is cleaned. Then, the second tantalum film 110 and the second copper film 111 are deposited successively to completely fill each of the via hole 108 and the wiring grooves 109. Thereafter, the respective portions of the second tantalum nitride film 110 and the second copper film 111 located outside the wiring grooves 109 are removed by CMP. As a result, the plug 112 composed of the second tantalum nitride film 110 and the second copper film 111 and connected to the lower-layer metal wire 104 is formed in the via hole 108, as shown in FIG. 3C. On the other hand, the upper-layer metal wires 113 each composed of the second tantalum nitride film 110 and the second copper film 111 are formed in the wiring grooves 109. Since the upper-layer metal wire 113 is formed in connected relation to the plug 112, an electronic device with an excellent metal wiring structure is formed.

Thus, according to the first embodiment, the density and carbon concentration of the third insulating film 106 composed of the carbon-containing silicon oxide film vary gradually in the direction of the thickness thereof. Specifically, the density and carbon concentration of the uppermost portion 106a of the third insulating film 106 are higher than the average density and average carbon concentration of the entire film. This reduces the degree of damage or destruction undergone by the carbon-containing silicon oxide film composing the third insulating film 106 during the formation of the fourth insulating film 107 on the third insulating film 106 and thereby suppresses the generation of the basic material. Since the density of the uppermost portion 106a of the third insulating film 106 is high, the absorption of nitrogen from an atmosphere in the third insulating film 106 is also suppressed. In addition, the density and carbon concentration of the lowermost portion 106b of the third insulating film 106 are higher than the average density and average carbon concentration of the entire film. This suppresses the diffusion of nitrogen or the basic material from the insulating film and the like formed below the third insulating film 106 into the third insulating film 106.

Hence, the first embodiment can achieve the following effect if a photolithographic step for forming the wiring groove 109 connecting to the via hole 108 in the third insulating film 106 is performed subsequently to the formation of the via hole 108 in the third insulating film 106. Since the diffusion of nitrogen and the basic material from the third insulating film 106 into the resist through the via hole 108 is suppressed, the acid generated from the acid generating material in the resist during exposure is prevented from being neutralized by the basic material and the like. This prevents chain reactions of acid generation in the chemically amplified resist from being halted and thereby prevents the resist from remaining in and over the via hole 108 as a result of defective development, i.e., defective patterning of the resist in the vicinity of the via hole 108. Specifically, the lower-layer metal wire 104 and the upper-layer metal wire 113 can be connected reliably to each other since a desired wiring groove pattern can be formed even in the vicinity of the via hole 108. This prevents a defective wiring structure that has been formed conventionally when a carbon-containing silicon oxide film is used as an inter-wire insulating film and thereby implements an electronic device with a highly reliable wiring structure and with a reduced parasitic capacitance between wires.

It is to be noted that, in the first embodiment, an increase in the film density of each of the uppermost and lowermost portions 106a and 106b or an increase in the carbon concentration of each of the uppermost and lowermost portions 106a and 106b slightly increases the relative dielectric constant of the third insulating film 106 (carbon-containing silicon oxide film). If the entire thickness of the carbon-containing silicon oxide film is on the order of, e.g., 500 nm, however, the increase in the relative dielectric constant of the entire carbon-containing silicon oxide film is substantially ignorable by adjusting the thickness of a portion with an increased film density or an increased carbon concentration (the uppermost portion 106a or the lowermost portion 106b) to about 10 nm or less.

Although the first embodiment has used the carbon-containing silicon oxide film as the third insulating film 106, another carbon-containing insulating film (insulating film containing silicon and carbon) may also be used instead.

Although the first embodiment has used the silicon oxide film as the fourth insulating film 107, another insulating film may also be used instead.

In the first embodiment, the density of each of the uppermost and lowermost portions 106a and 106b of the third insulating film 106 is preferably 1.8 g/cm$^3$ or more and the average density of the entire third insulating film 106 is preferably 1.4 g/cm$^3$ or less. The arrangement reliably achieves the effect described above.

In the first embodiment, the carbon concentration of each of the uppermost and lowermost portions 106a and 106b of the third insulating film 106 is preferably 30 at % or more and the average carbon concentration of the entire third insulating film 106 is preferably 20 at % or less. The arrangement reliably achieves the effect described above.

Although the first embodiment has formed the wiring structure composed of the lower-layer metal wire 104 and the upper-layer metal wire 113 which are connected by the plug 112, the present invention is not limited thereto. It will easily be appreciated that a memory cell structure composed of a transistor (the diffusion layer thereof) and a capacitor (the lower electrode thereof) which are connected by, e.g., a contact plug may also be formed.

A detailed description will be given herein below to a method for forming a carbon-containing silicon oxide film having an uppermost portion with a film density of 1.8 g/cm$^3$ or more.

The present embodiment forms a carbon-containing silicon oxide film by plasma CVD using, e.g., dimethyldimethoxysilane ($Si(CH_3)_2(OCH_3)_2$) serving as raw material gas (silicon supply gas) and helium (He) gas. During the formation, an RF power of 13.56 MHz is applied under basic film deposition conditions under which a film deposition temperature is 400° C., a film deposition pressure is 500 Pa, a flow rate of dimethyldimethoxysilane is 150 ml/min (standard condition), and a flow rate of He is 50 ml/min (standard condition). This allows the formation of a carbon-containing silicon oxide film having a density of about 1.3 g/cm$^3$, a carbon concentration of about 20 at %, and a relative dielectric constant of about 2.8. If a film is formed under conditions obtained by changing only the flow rate of the dimethyldimethoxysilane from 150 ml/min (standard condition) to 10 ml/min (standard condition) without changing the other basic film deposition conditions (film deposition temperature, film deposition pressure, flow rate of He) and RF power, a supplied silicon component is reduced significantly and the depositing speed is reduced to about ⅕ of the speed under the basic film deposition conditions. As a result, a carbon-containing silicon oxide film relatively high in each of density and carbon concentration, specifically a carbon-containing silicon oxide film having a film density of about 1.8 g/cm$^3$, a carbon concentration of about 30 at %, and a relative dielectric constant of about 5.0 is formed. Accordingly, the present embodiment performs film deposition by gradually reducing the flow rate of dimethyldimethoxysilane from 150 ml/min (standard condition) to 10 ml/min (standard condition) at the final stage of the formation of a carbon-containing silicon oxide film. Such a film deposition method allows the formation of a carbon-containing silicon oxide film of which only the uppermost portion is high in film density. The formation of the carbon-containing silicon oxide film is completed by turning off the RF power.

Figure 4:
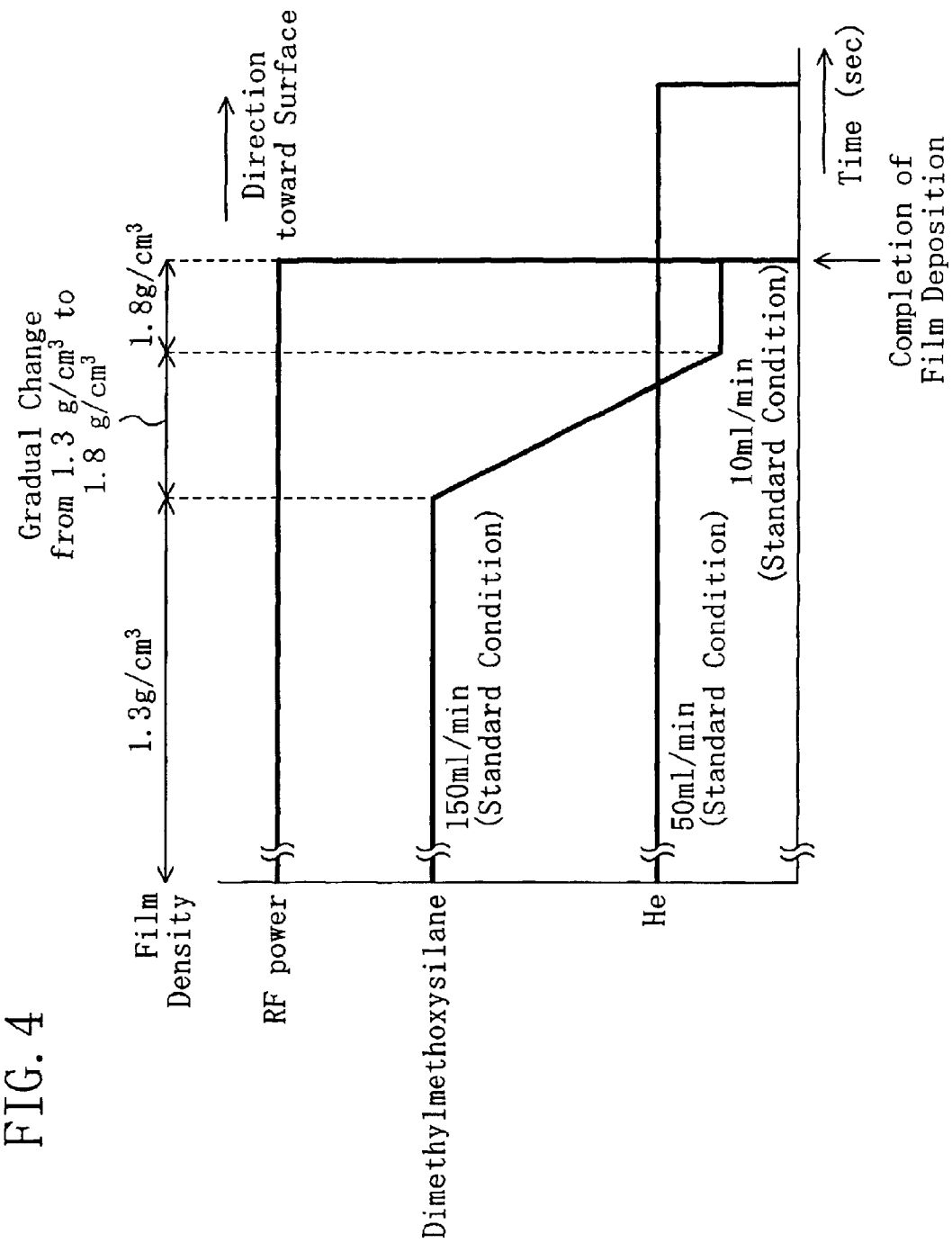
FIG. 4 is a view showing main parameters varying with time when a carbon-containing silicon oxide film having only an uppermost portion thereof higher in film density is formed by using the method for fabricating an electronic device according to the first embodiment.

FIG. 4 is a view showing main parameters varying with time when a carbon-containing silicon oxide film of which only the uppermost portion is high in film density is formed by the foregoing film forming method.

Figure 5:
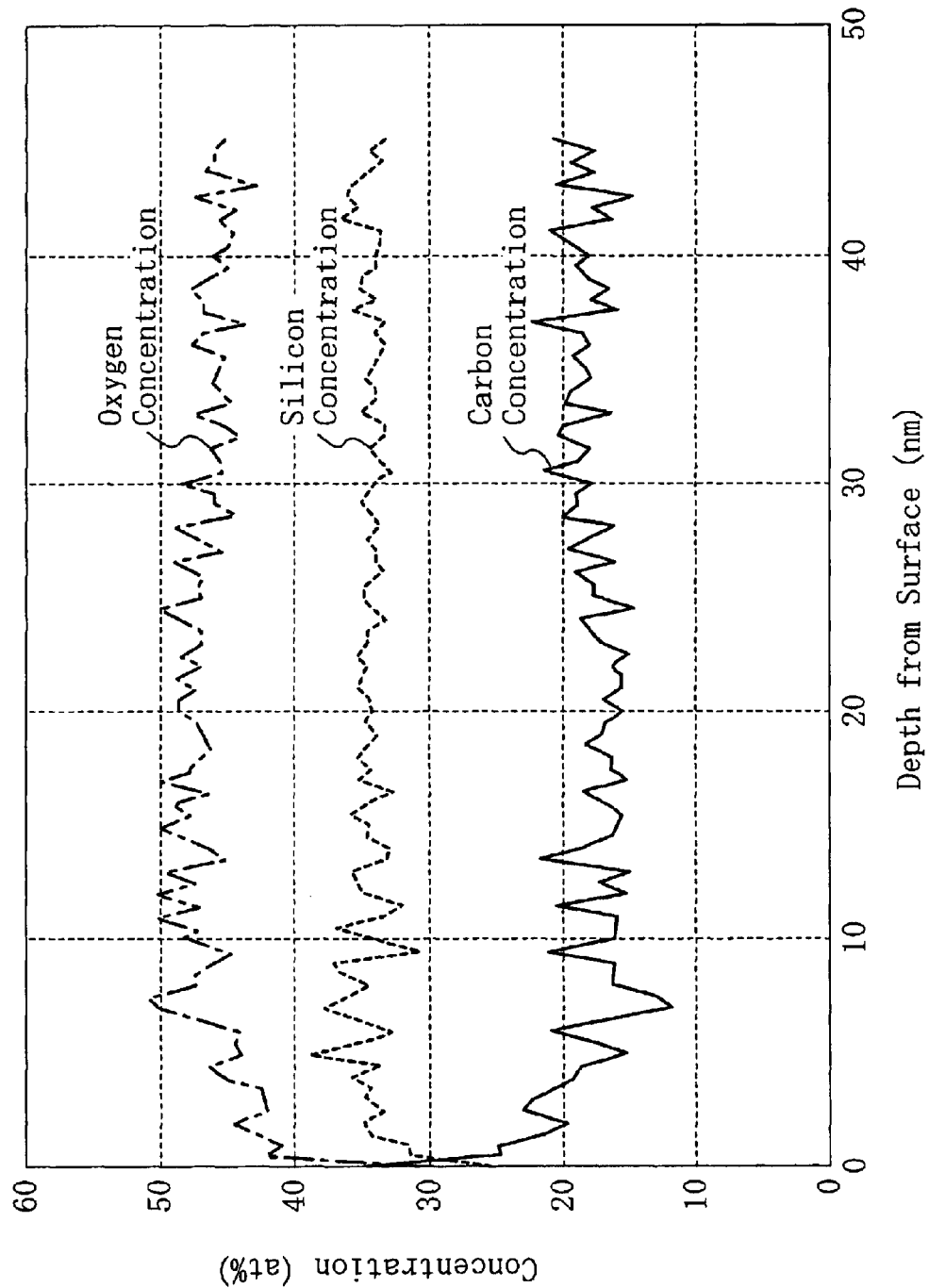
FIG. 5 is a view showing variations in film composition in the direction of the thickness of a carbon-containing silicon oxide film formed by using the method for fabricating an electronic device according to the first embodiment.

FIG. 5 is a view showing variations in film composition in the direction of the thickness of the carbon-containing silicon oxide film formed by the foregoing film forming method. In FIG. 5, the abscissa represents a depth from the film surface and the ordinate represents the atomic concentration of each of the elements containing in the film. Since the flow rate of the silicon supply gas is reduced at the final stage of the formation of the carbon-containing silicon oxide film, the silicon concentration and the oxygen concentration in the uppermost portion of the film are reduced as shown in FIG. 5. By contrast, the carbon concentration in the uppermost portion of the film is increased significantly compared with the decrements of the silicon concentration and the oxygen concentration in the uppermost portion of the film. This allows the formation of the carbon-containing silicon oxide film having the uppermost portion high in carbon density and film density, specifically, a carbon-containing silicon oxide film having a film density of about 1.8 g/cm$^3$ and a carbon concentration of about 30 at %.

To form a carbon-containing silicon oxide film of which the lowermost portion has a film density of 1.8 g/cm$^3$ or more, the film deposition may be performed appropriately by gradually increasing the flow rate of dimethyldimethoxysilane from 10 ml/min (standard condition) to 150 ml/min (standard condition) during the initial period of the formation of the carbon-containing silicon oxide film.

Embodiment 2

An electronic device according to a second embodiment of the present invention and a method for fabricating the same will be described herein below with reference to the drawings.

The second embodiment is different from the first embodiment in that the average density of the fourth insulating film 107 (silicon oxide film) formed on the third insulating film 106 is about 1.7 g/cm$^3$ or less.

The second embodiment achieves the following effect in addition to the effect achieved by the first embodiment. That is, the basic material and the like contained in the third insulating film 106 (carbon-containing silicon oxide film) is more likely to be diffused into the upper-layer fourth insulating film 107. If the total amount of the basic material and the like generated in the carbon-containing silicon oxide film is assumed to be the same, therefore, the localized diffusion of the basic material and the like into the via hole 108 is suppressed compared with the case where an insulating film having a density over 1.7 g/cm$^3$ is provided on the third insulating film 106. As a result, an increase in the concentration of the base in the portion of the resist located adjacent to the via hole 108 can be prevented in the photolithographic step for forming the wiring grooves 109 in the third insulating film 106. This more reliably prevents the poisoning phenomenon in which the resist remains in the via hole 108 even after development, i.e., defective patterning of the resist.

A problem presented by the foregoing poisoning phenomenon is a reaction between a basic material such as amine generated from the carbon-containing silicon oxide film composing the third insulating film 106 and an acid generated from a chemically amplified resist so that the resist remains in the via hole 108. A detailed description will be given herein below to the reason that poisoning can be prevented by the present embodiment.

First, it is assumed that poisoning is not a phenomenon which occurs if a basic material such as amine is generated even in a small amount but a phenomenon in which the acid generated from the chemically amplified resist loses activeness if the basic material is generated in a specified amount or more so that the resist remains. If the amount of the basic material diffused into the via hole 108 is small, poisoning does not occur.

If a protective film (corresponding to the fourth insulating film 107) is not formed on the surface of the carbon-containing silicon oxide film or if surface reformation is not performed with respect to the carbon-containing silicon oxide film as has been practiced with a conventional technique, the basic material is released substantially equally from the upper surface of the carbon-containing silicon oxide film and from the inner wall surface of the via hole. In this case, resist poisoning does not occur in the via hole since the concentration of the basic material in the vicinity of the via hole does not exceed the "threshold value" at which poisoning can occur. However, since the protective film or the like does not exist on the surface of the carbon-containing silicon oxide film, the film may be damaged by plasma etching in the subsequent step, e.g., the step of forming the wiring grooves in the carbon-containing silicon oxide film. Therefore, it is an improper method not to form a protective film or the like on the surface of the carbon-containing silicon oxide film if consideration is given to each of the wire forming steps.

By contrast, the present embodiment has deposited the fourth insulating film 107, which is a silicon oxide film having a density of 1.7 g/cm$^3$ or less, on the third insulating film 106. Since the density of the fourth insulating film 107 is low, the arrangement allows a certain proportion of the basic material generated in the third insulating film 106 to pass through the fourth insulating film 107. As a result, the release of amine and the like from the third insulating film 106 is not localized to the inner wall surface of the via hole 108 and amine and the like are released also from the upper surface of the fourth insulating film 107. Compared with the case where the density of the fourth insulating film 107 is over 1.7 g/cm$^3$ on the assumption that the total amount of the basic material generated in the third insulating film 106, i.e., the carbon-containing silicon oxide film is the same, the amount of the basic material diffused into the via hole 108 is reduced.

If the density of the fourth insulating film 107 is 1.7 g/cm$^3$ or less as in the present embodiment, the basic material is released also from the upper surface of the fourth insulating film 107 and therefore the amount of the basic material released into the via hole 108 is reduced so that the occurrence of poisoning is prevented. If the film density of the fourth insulating film 107 exceeds 1.7 g/cm$^3$, on the other hand, the basic material is less likely to be released from the upper surface of the fourth insulating film 107 and therefore amine and the like contained in the third insulating film 106 are released primarily from the inner wall surface of the via hole 108 so that resist poisoning is more likely to occur in the via hole 108.

If consideration is given to a strength required of the fourth insulating film 107 in the CMP step (see FIG. 3C) in the second embodiment, the average density of the fourth insulating film 107 is preferably about 1.5 g/cm$^3$ or more.

Embodiment 3

An electronic device according to a third embodiment of the present invention and a method for fabricating the same will be described herein below with reference to the drawings.

The third embodiment is different from the first embodiment in that film deposition conditions are adjusted in the step of depositing the fourth insulating film 107 composed of a silicon oxide film with a thickness of about 50 nm on the third insulating film 106 by plasma CVD (see FIG. 2C) such that the abundance ratio of oxygen to silicon each contained in at least the portion of the fourth insulating film 107 located adjacent to the third insulating film 106 is less than 2. In other words, the fourth insulating film 107 is formed under conditions such that the stoichiometric composition of the portion of the fourth insulating film 107 in contact with the third insulating film 106 is the same as the composition of a silicon-rich silicon oxide film.

Specifically, the flow rate of the oxygen supply gas is reduced during the initial period of the step of depositing the fourth insulating film 107 by plasma CVD using the silicon supply gas (such as tetraethoxysilane gas) and the oxygen supply gas (such as $O_2$ gas).

The third embodiment achieves the following effect in addition to the effect achieved by the first embodiment. Since the first stage of the step of depositing the fourth insulating film 107 is performed in an oxygen lacking state, oxygen ions or oxygen radicals which induce plasma damage to the third insulating film 106, i.e., the carbon-containing insulating film can be reduced during the initial period so that the degree of damage or destruction undergone by the third insulating film 106 is reduced reliably. In this case, a silicon-rich silicon oxide film is formed during the initial period of the deposition of the fourth insulating film 107. The silicon-rich silicon oxide film prevents the oxygen ions or the oxygen radicals from reaching the third insulating film 106 located thereunder. Since the silicon-rich silicon oxide film functions as the protective film, damage induced by the plasma in the third insulating film 106 when the fourth insulating film 107 is deposited continuously thereafter can be prevented more reliably.

FIG. 6 is a view showing main parameters varying with time when the fourth insulating film 107 (silicon oxide film) is formed by the film forming method described above. As a silicon supply gas, tetraethoxysilane gas is used, while $O_2$ gas is used as an oxygen supply gas. The flow rate of the tetraethoxysilane gas is constant.

As shown in FIG. 6, the formation of the fourth insulating film 107 is initiated by the application of an RF power, but the flow rate of the $O_2$ gas is suppressed during the initial period of film deposition. Accordingly, the film deposition is performed in the state in which the flow rate of the tetraethoxysilane gas as the silicon supply gas is considerably higher than the flow rate of the $O_2$ gas during the initial period thereof. Consequently, film deposition resulting from the decomposition of tetraethoxysilane is dominant during the initial period of film deposition so that a silicon oxide film at a high silicon content (silicon-rich silicon oxide film) is formed. The film deposition condition becomes stable by increasing the flow rate of the $O_2$ gas thereafter so that a silicon oxide film ($SiO_2$ film) having a stoichiometric composition is formed. In accordance with the foregoing film forming method, the portion of the fourth insulating film 107 located adjacent to the third insulating film 106 has a composition in which the abundance ratio of oxygen to silicon is less than 2.

Embodiment 4

An electronic device according to a fourth embodiment of the present invention and a method for fabricating the same will be described herein below with reference to the drawings.

The fourth embodiment is different from the first embodiment in that the step of forming the fourth insulating film 107 is performed while preventing the third insulating film 106 from being exposed to an atmosphere containing nitrogen. Specifically, the step of forming the third insulating film 106 and the step of forming the fourth insulating film 107 may be performed continuedly in the same film deposition chamber. Alternatively, the step of forming the third insulating film 106 and the step of forming the fourth insulating film 107 may be performed successively in different film deposition chambers in a multi-chamber CVD (Chemical Vapor Deposition) system without opening it to an atmosphere.

The fourth embodiment achieves the following effect in addition to the effect achieved by the first embodiment. Since the amount of nitrogen absorbed in the third insulating film 106, i.e., the carbon-containing silicon oxide film can be minimized, a reaction between a methyl group or the like generated in the carbon-containing silicon oxide film and nitrogen can be suppressed. This prevents the formation of a basic material, such as amine, in a large amount in the carbon-containing silicon oxide film.

Embodiment 5

An electronic device according to a fifth embodiment of the present invention and a method for fabricating the same will be described herein below with reference to the drawings.

The fifth embodiment is different from the first embodiment in that the step of forming the fourth insulating film 107 composed of the silicon oxide film on the third insulating film 106 uses spin coating or thermal CVD instead of plasma CVD.

The fifth embodiment achieves the following effect in addition to the effect achieved by the first embodiment. That is, the plasma damage to the third insulating film 106, i.e., the carbon-containing silicon oxide film can be prevented more reliably than in the case where the fourth insulating film 107 is formed by plasma CVD.

Embodiment 6

An electronic device according to a sixth embodiment of the present invention and a method for fabricating the same will be described herein below with reference to the drawings.

Figure 7A:
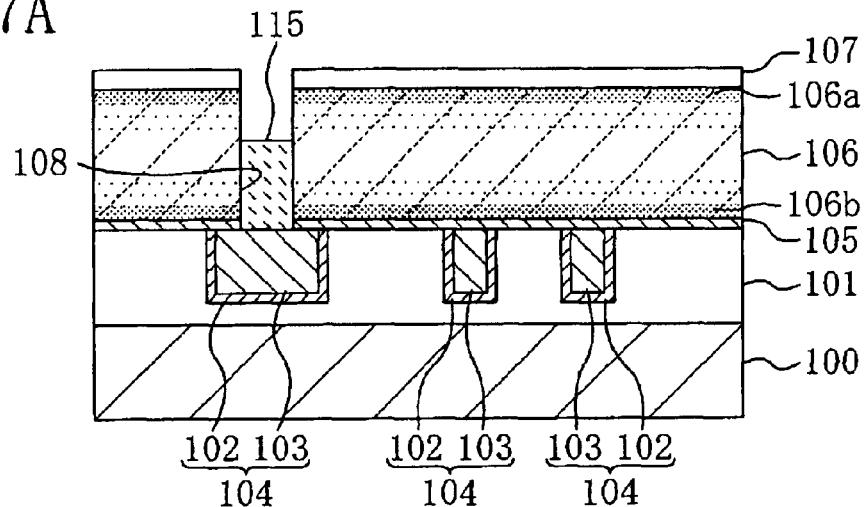
FIGS. 7A and 7B are cross-sectional views illustrating the individual process steps of a method for fabricating an electronic device according to a sixth embodiment of the present invention.
Figure 7B:
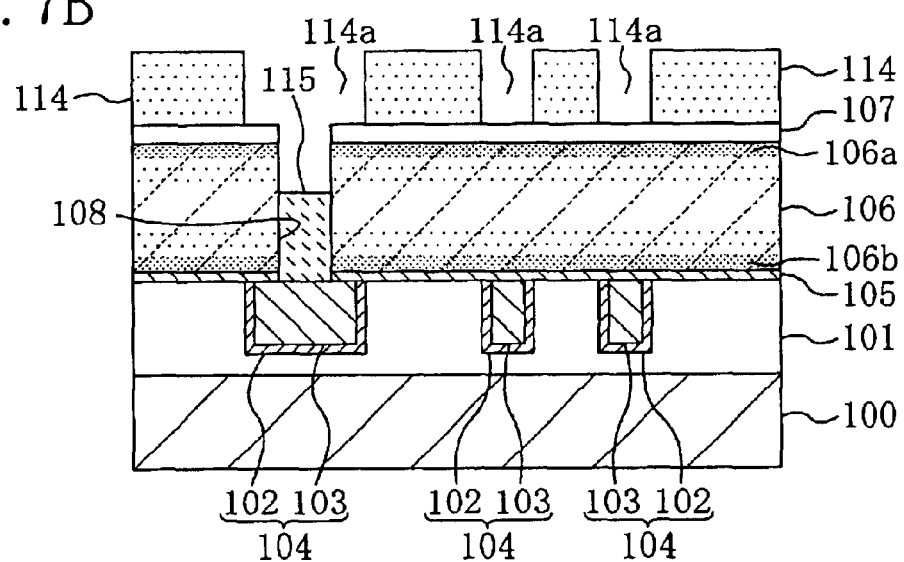
Figure 8:
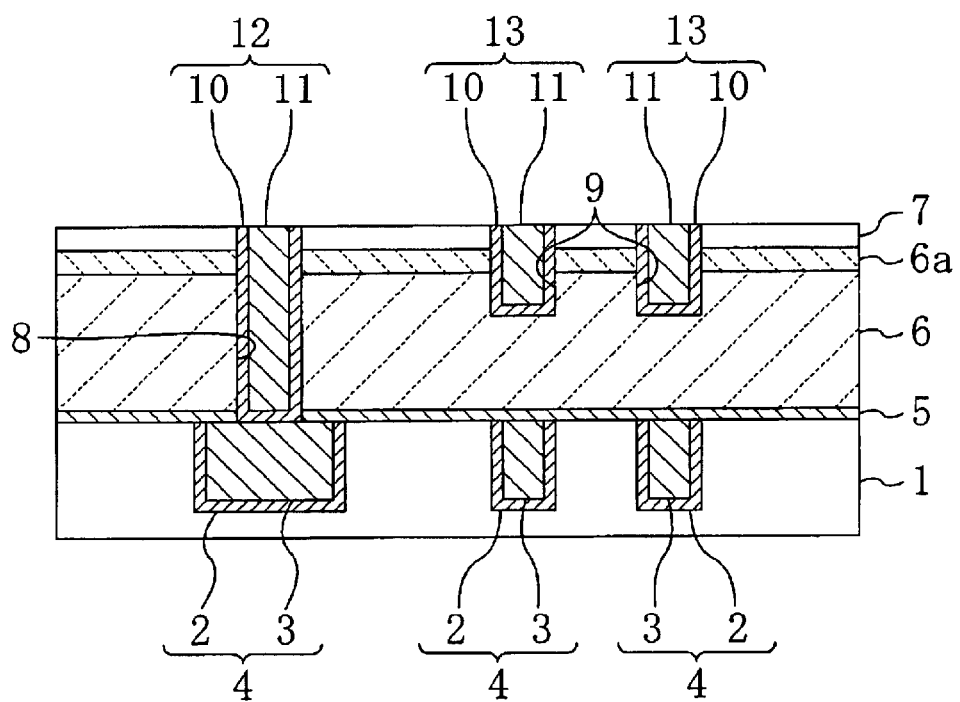
FIG. 8 is a cross-sectional view of a conventional electronic device.
Figure 9A:
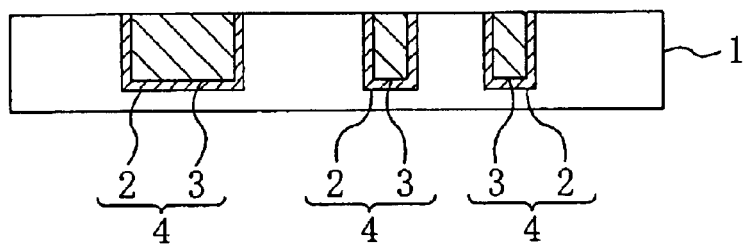
FIGS. 9A to 9D are cross-sectional views illustrating the individual process steps of a conventional method for fabricating an electronic device.
Figure 9B:
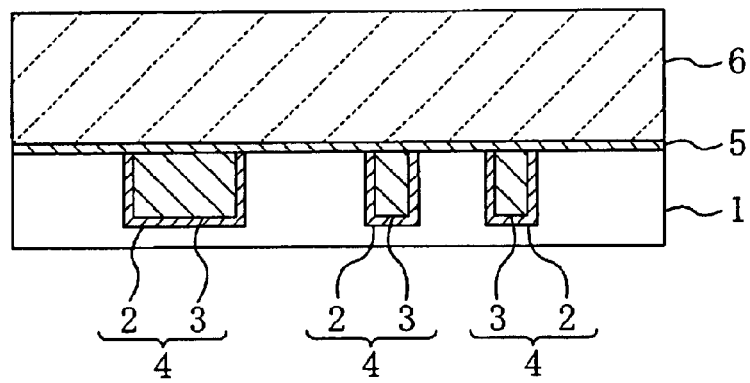
Figure 9C:
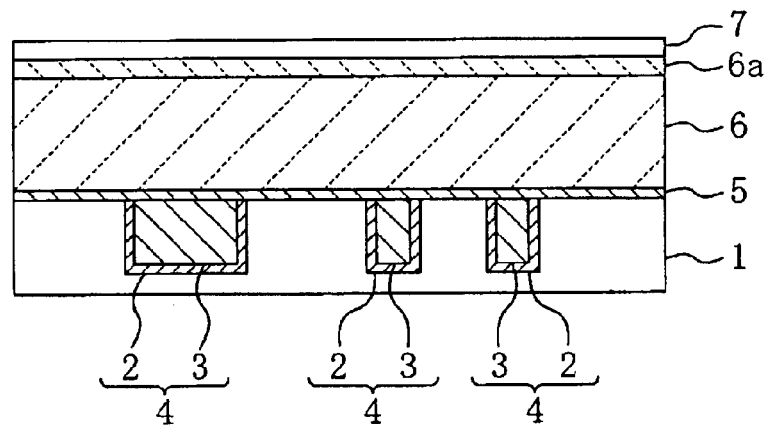
Figure 9D:
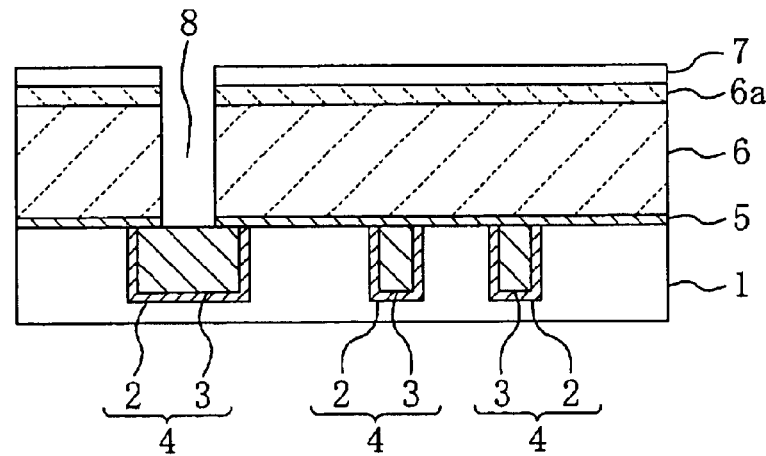
Figure 10A:
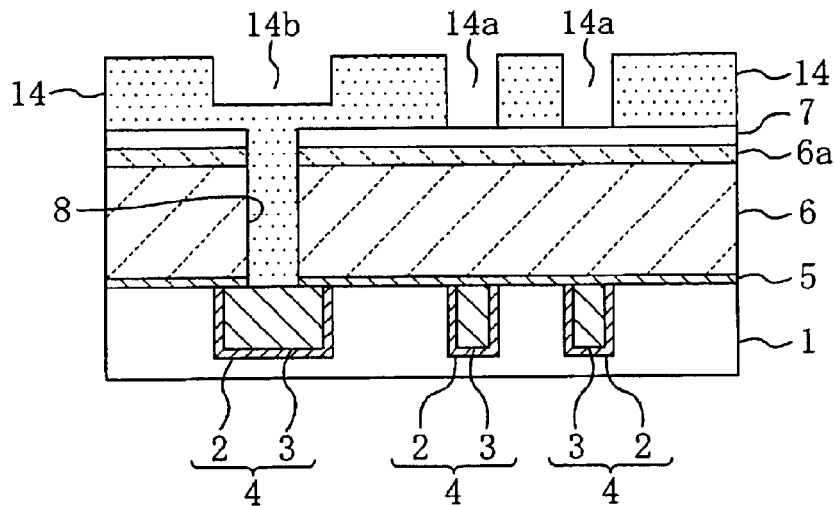
FIGS. 10A to 10C are cross-sectional views illustrating the individual process steps of the conventional method for fabricating an electronic device.
Figure 10B:
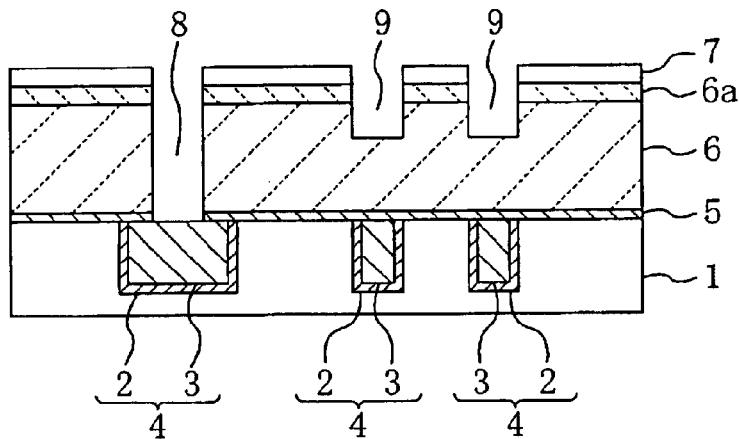
Figure 10C:
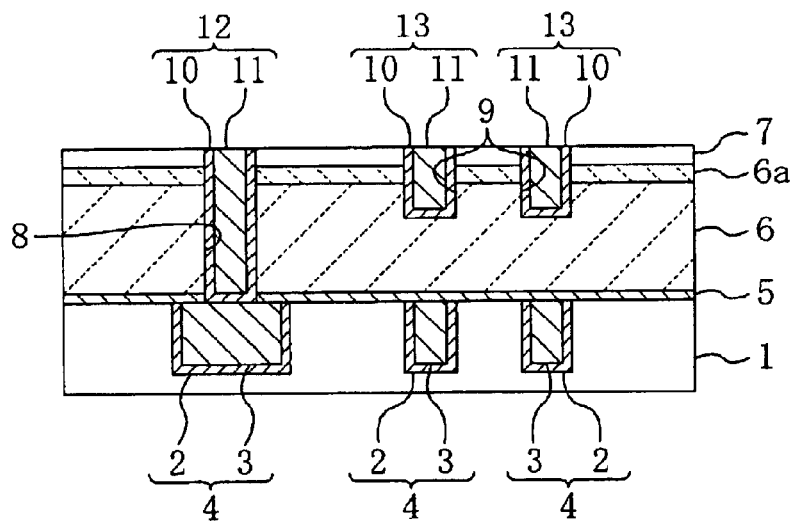

FIGS. 7A and 7B are cross-sectional views illustrating the individual process steps of the method for fabricating the electronic device according to the sixth embodiment. The description of members shown in FIGS. 7A and 7B which are the same as those used in the electronic device according to the first embodiment shown in FIG. 1 will be omitted by retaining the same reference numerals.

The sixth embodiment is different from the first embodiment in that it further comprises the step of forming a dummy plug in the via hole 108 between the step of forming the via hole 108 (the step shown in FIG. 2D according to the first embodiment) and the step of forming the resist film 114 (the step shown in FIG. 3A according to the first embodiment).

Specifically, a resist film for dummy plug is deposited on the fourth insulating film 107 to fill up the via hole 108 after the step shown in FIG. 2D and then the resist film is etched back to form a dummy plug 115 in the via hole 108, as shown in FIG. 7A. As the resist for dummy plug, a non-photosensitive resist, e.g., an organic polymer or the like is used.

Next, a photoresist is coated on the fourth insulating film 107 with the dummy plug 115 being formed in the via hole 108. By performing photolithography (exposure and development) with respect to the coated photoresist, the resist film 114 having the openings 114a corresponding to the wiring groove formation regions is formed, as shown in FIG. 7B.

Next, dry etching is performed with respect to each of the fourth and third insulating films 107 and 106 by using the resist film 114 and the dummy plug 115 as a mask, thereby forming the wiring groove 109 connecting to the via hole 108, as shown in FIG. 3B. It is to be noted that the resist film 114 and the dummy plug 115 are removed after the foregoing dry etching, the substrate 100 is cleaned thereafter, and then the step shown in FIG. 3C according to the first embodiment is performed.

The sixth embodiment achieves the following effect in addition to the effect achieved by the first embodiment. Since the via hole 108 is filled with the dummy plug 115, the stepped portion of the fourth insulating film 107 serving as the underlie during the coating of the resist in the photolithographic step for forming the wiring groove 109 connecting to the via hole 108 in the third and fourth insulating films 106 and 107 is reduced so that the resist is coated with higher planarity. Consequently, exposure light reliably reaches a deep portion in the resist deposited over the dummy plug 115 in the via hole 108 and thereby prevents the occurrence of unneeded resist residues after the development. As a result, a trench pattern with high size controllability can be formed.

Since the bottom portion of the via hole 108 is covered with the dummy plug 115 according to the sixth embodiment, the occurrence of damage to the bottom portion of the via hole 108, specifically to the lower-layer metal wire 104, can be prevented in the etching step subsequent to the foregoing photolithographic step.

Since the wall surface of the via hole 108 is covered with the dummy plug 115 according to the sixth embodiment, the permeation of amine and the like from the third insulating film 106, i.e., the carbon-containing silicon oxide film into the via hole 108, i.e., the occurrence of poisoning can be prevented by using a proper material, e.g., an organic material or the like as the material of the dummy plug 115.

In the sixth embodiment, the upper surface of the dummy plug 115 is preferably set at the same level as the bottom surface of the wiring groove 109 to be formed. This prevents fence-like residues from occurring at the portion of the bottom surface of the wiring groove 109 located adjacent to the via hole 108 when etching is performed to form the wiring groove 109.

What is claimed is:

1. An electronic device comprising:
a first insulating film formed on a substrate, a conductive film formed in the first insulating film, and
wherein the first insulating film includes silicon and carbon, and the first insulating film has a density varying gradually in a direction of a thickness thereof.

2. The electronic device of claim 1, wherein an uppermost portion of the first insulating film has a density higher than an average density of the first insulating film.

3. The electronic device of claim 2, wherein the density of the uppermost portion is 1.8 g/cm$^3$ or more and the average density is 1:4 g/cm$^3$ or less.

4. The electronic device of claim 1, wherein a lowermost portion of the first insulating film has a density higher than an average density of the first insulating film.

5. The electronic device of claim 4, wherein the density of the lowermost portion is 1.8 g/cm$^3$ or more and the average density is 1.4 g/cm$^3$ or less.

6. The electronic device of claim 1, further comprising:
a second insulating film formed on the first insulating film, wherein
an average density of the second insulating film is 1.5 g/cm$^3$ or more and 1.7 g/cm$^3$ or less.

7. The electronic device of claim 1, further comprising:
a second insulating film formed on the first insulating film, wherein
an abundance ratio of oxygen to silicon each contained in a portion of the second insulating film located adjacent to the first insulating film is less than 2.

8. An electronic device comprising:
a first insulating film formed on a substrate, a conductive film formed in the first insulating film, and
wherein the first insulating film includes silicon and carbon, and the first insulating film has a carbon concentration varying gradually in a direction of a thickness thereof.

9. The electronic device of claim 8, wherein an uppermost portion of the first insulating film has a carbon concentration higher than an average carbon concentration of the first insulating film.

10. The electronic device of claim 9, wherein the carbon concentration of the uppermost portion is 30 at % or more and the average carbon concentration is 20 at % or less.

11. The electronic device of claim 8, wherein a lowermost portion of the first insulating film has a carbon concentration higher than an average carbon concentration of the first insulating film.

12. The electronic device of claim 11, wherein the carbon concentration of the lowermost portion is 30 at % or more and the average carbon concentration is 20 at % or less.

13. The electronic device of claim 8, further comprising:
a second insulating film formed on the first insulating film, wherein
an average density of the second insulating film is 1.5 g/cm$^3$ or more and 1.7 g/cm$^3$ or less.

14. The electronic device of claim 8, further comprising:
a second insulating film formed on the first insulating film, wherein
an abundance ratio of oxygen to silicon each contained in a portion of the second insulating film adjacent to the first insulating film is less than 2.

* * * * *